(12) United States Patent
Ueki et al.

(10) Patent No.: US 9,755,606 B2
(45) Date of Patent: Sep. 5, 2017

(54) COMMON MODE FILTER AND ESD-PROTECTION-CIRCUIT-EQUIPPED COMMON MODE FILTER

(71) Applicant: Murata Manufacturing Co., Ltd., Nagaokakyo-shi, Kyoto-fu (JP)

(72) Inventors: Noriyuki Ueki, Nagaokakyo (JP); Hisashi Akiyama, Nagaokakyo (JP)

(73) Assignee: Murato Manufacturing Co., Ltd., Kyoto (JP)

( * ) Notice: Subject to any disclaimer, the term of this patent is extended or adjusted under 35 U.S.C. 154(b) by 101 days.

(21) Appl. No.: 15/002,555

(22) Filed: Jan. 21, 2016

(65) Prior Publication Data

US 2016/0142031 A1    May 19, 2016

Related U.S. Application Data

(63) Continuation of application No. PCT/JP2014/082208, filed on Dec. 5, 2014.

(30) Foreign Application Priority Data

Dec. 9, 2013  (JP) .................................. 2013-253892

(51) Int. Cl.
*H02H 9/00* (2006.01)
*H03H 7/01* (2006.01)
(Continued)

(52) U.S. Cl.
CPC .......... *H03H 7/0115* (2013.01); *H02H 9/045* (2013.01); *H02H 9/046* (2013.01);
(Continued)

(58) Field of Classification Search
USPC ........................................... 361/56, 117–120
See application file for complete search history.

(56) References Cited

U.S. PATENT DOCUMENTS 7,446,992 B2 * 11/2008 Terada ................. H03H 7/0107
361/117
8,879,230 B2 * 11/2014 Wang ................... H03H 7/0138
361/118

(Continued)

FOREIGN PATENT DOCUMENTS

JP    2003-133135 A    5/2003
JP    2005-217839 A    8/2005
(Continued)

OTHER PUBLICATIONS

Official Communication issued in International Patent Application No. PCT/JP2014/082208, dated Feb. 17, 2015.

*Primary Examiner* — Danny Nguyen
(74) *Attorney, Agent, or Firm* — Keating & Bennett, LLP

(57) ABSTRACT

On a first-signal-line side, a first resonant circuit is defined by a first inductance element, a first capacitance element, a second capacitance element, a third inductance element and a fifth inductance element, a third resonant circuit is defined by the first inductance element, the first capacitance element and the second capacitance element, and a fifth resonant circuit is defined by the first inductance element, the third inductance element, the first capacitance element, the second capacitance element and the fifth capacitance element. Similarly, on a second-signal-line side, a second resonant circuit, a fourth resonant circuit and a sixth resonant circuit are provided.

15 Claims, 15 Drawing Sheets

(51) Int. Cl.
*H03H 7/09* (2006.01)
*H03H 7/42* (2006.01)
*H02H 9/04* (2006.01)
*H01F 17/00* (2006.01)

(52) U.S. Cl.
CPC .............. *H03H 7/09* (2013.01); *H03H 7/427* (2013.01); *H01F 2017/0026* (2013.01)

(56) References Cited

U.S. PATENT DOCUMENTS

| | | |
|---|---|---|
| 2003/0076211 A1 | 4/2003 | Matsuta et al. |
| 2011/0279935 A1 | 11/2011 | Iwasa et al. |
| 2013/0169380 A1 | 7/2013 | Tamaki |
| 2014/0368307 A1 | 12/2014 | Kato |

FOREIGN PATENT DOCUMENTS

| | | |
|---|---|---|
| JP | 2006-033421 A | 2/2006 |
| JP | 2011-228824 A | 11/2011 |
| JP | 2012-019443 A | 1/2012 |
| JP | 2012-070279 A | 4/2012 |
| WO | 2010/087184 A1 | 8/2010 |
| WO | 2013/136936 A1 | 9/2013 |

* cited by examiner frequency (0.5GHz to 3.0GHz)

COMMON MODE FILTER AND ESD-PROTECTION-CIRCUIT-EQUIPPED COMMON MODE FILTER

BACKGROUND OF THE INVENTION

1. Field of the Invention

The present invention relates to a common mode filter that suppresses common mode noise that propagates through a differential transmission line, and to an ESD-protection-circuit-equipped common mode filter.

2. Description of the Related Art

Conventionally, a common-mode choke coil is used to suppress common mode noise attempting to propagate through a differential transmission line. A common-mode choke coil includes two coils, the two coils being configured such that magnetic fields generated around the coils by differential mode signals (normal mode signals) cancel each other out and the magnetic fields strengthen each other for common mode signals (common mode noise), as described in Japanese Unexamined Patent Application Publication No. 2003-133135, for example.

Generally, it is necessary that the coils each have a large inductance and that there be a large coupling coefficient between the coils in such a common-mode choke coil.

However, when the inductances of the coils are large and the coupling coefficient between the coils is large, the self-resonant frequency is low and the transmission loss of a signal is large. Consequently, it is difficult to use such a common-mode choke coil in a differential transmission line that is used in a high frequency band and that is required to have low transmission loss such as a differential transmission line for a high-speed interface like USB or HDMI (registered trademark), for example.

SUMMARY OF THE INVENTION

Preferred embodiments of the present invention provide a common mode filter that, despite having a small inductance and a small coupling coefficient, is highly effective at suppressing common mode noise, has excellent characteristics at high frequencies and has small transmission loss.

A common mode filter and an ESD-protection-circuit-equipped common mode filter according to various preferred embodiments of the present invention have the following configurations.

A common mode filter according to a preferred embodiment of the present invention that is to be inserted into a first signal line and a second signal line of a differential transmission line, includes a first inductance element that is to be inserted in series with the first signal line; a second inductance element that is to be inserted in series with the second signal line; a third inductance element that includes a first end that is connected to a neutral point with respect to the first signal line and the second signal line; a fourth inductance element that includes a first end that is connected to the neutral point; a first capacitance element that is connected between the first end of the first inductance element and a second end of the third inductance element; a second capacitance element that is connected between a second end of the first inductance element and the second end of the third inductance element; a third capacitance element that is connected between the first end of the second inductance element and a second end of the fourth inductance element; a fourth capacitance element that is connected between a second end of the second inductance element and the second end of the fourth inductance element; a fifth inductance element that is connected between the neutral point and ground; and a fifth capacitance element that is connected between the neutral point and ground; wherein a first resonant circuit (series resonant circuit) is defined by the first inductance element, the third inductance element, the second capacitance element, and the fifth inductance element; a second resonant circuit (series resonant circuit) is defined by the second inductance element, the third capacitance element, the fourth capacitance element, the fourth inductance element and the fifth inductance element; a third resonant circuit (parallel resonant circuit) is defined by the first inductance element, the first capacitance element and the second capacitance element; a fourth resonant circuit (parallel resonant circuit) is defined by the second inductance element, the third capacitance element and the fourth capacitance element; a fifth resonant circuit (series resonant circuit) is defined by the first inductance element, the third inductance element, the first capacitance element, the second capacitance element and the fifth capacitance element; and a sixth resonant circuit (series resonant circuit) is defined by the second inductance element, the fourth inductance element, the third capacitance element, the fourth capacitance element and the fifth capacitance element.

It is preferable that a circuit defined by the first inductance element, the first capacitance element, the second capacitance element and the third inductance element, and a circuit defined by the second inductance element, the third capacitance element, the fourth capacitance element and the fourth inductance element be symmetrical. With this configuration, the amount of conversion from the common mode to the differential mode and the amount of conversion from the differential mode to the common mode are small.

It is preferable that a first resonant frequency, which is a resonant frequency of the first and second resonant circuits, a second resonant frequency, which is a resonant frequency of the third and fourth resonant circuits, and a third resonant frequency, which is a resonant frequency of the fifth and sixth resonant circuits, be different from one another. As a result of this, common mode noise is attenuated across a wide band.

It is preferable that, at the resonant frequency of the third resonant circuit and the fourth resonant circuit, the impedance of the first capacitance element, the second capacitance element, the third capacitance element and the fourth capacitance element be larger than the series impedance of the third inductance element and the fourth inductance element. In this way, an increase in the insertion loss of a differential mode signal is suppressed.

A common mode filter according to another preferred embodiment of the present invention that is to be inserted into a first signal line and a second signal line of a differential transmission line, includes a first inductance element that is to be inserted in series with the first signal line; a second inductance element that is to be inserted in series with the second signal line; a third inductance element that includes a first end connected to a neutral point with respect to the first signal line and the second signal line and includes a second end to be connected to the first signal line; a fourth inductance element that includes a first end connected to the neutral point and includes a second end to be connected to the second signal line; a fifth inductance element that is connected between the neutral point and ground; and a fifth capacitance element that is connected between the neutral point and ground; wherein an attenuation pole is located inside a passband of the common mode filter by a resonant circuit defined by the fifth inductance element and the fifth capacitance element.

It is preferable that the third inductance element and the fourth inductance element be wound and connected so as to be differentially coupled for common mode noise and cumulatively coupled for differential mode signals. In this way, an increase in differential mode loss is suppressed.

An ESD-protection-circuit-equipped common mode filter according to yet another preferred embodiment of the present invention includes the common mode filter according to any one of the preferred embodiments of the present invention described above, and an ESD protection element to be inserted between the first signal line and ground and between the second signal line and ground.

It is preferable that the common mode filter be provided in a re-wiring layer of a semiconductor substrate and that a Zener diode defining and functioning as the ESD protection element be provided in the semiconductor substrate. In this way, the number of elements to be mounted on a circuit board of an electrical device is reduced.

A common mode filter according to a preferred embodiment of the present invention that is to be inserted into a first signal line and a second signal line of a differential transmission line, includes a first inductance element (L1) that is to be inserted in series with the first signal line; a second inductance element (L2) that is to be inserted in series with the second signal line; a third inductance element (L3) that includes a first end connected to a neutral point with respect to the first signal line and the second signal line and includes a second end to be connected to the first signal line; a fourth inductance element (L4) that includes a first end connected to the neutral point and includes a second end to be connected to the second signal line; a fifth inductance element (L5) that is connected between the neutral point and ground; a first shunt connection capacitance element (C1/C2) that is connected between the first inductance element (L1) and the third inductance element (L3); and a second shunt connection capacitance element (C3/C4) that is connected between the second inductance element (L2) and the fourth inductance element (L4); wherein an attenuation pole (f1) is defined by a series resonant circuit including the first shunt connection capacitance element (C1/C2), the third inductance element (L3) and the fifth inductance element (L5) and a series resonant circuit including the second shunt connection capacitance element (C3/C4), the fourth inductance element (L4) and the fifth inductance element (L5), and an attenuation pole (f2) is defined by a parallel resonant circuit including the first inductance element (L1) and the first shunt connection capacitance element (C1/C2) and a parallel resonant circuit including the second inductance element (L2) and the second shunt connection capacitance element (C3/C4).

With this configuration, common mode noise is attenuated across a wide band including an attenuation pole at a frequency (f1) and an attenuation pole at a frequency (f2).

A common mode filter according to a preferred embodiment of the present invention that is to be inserted into a first signal line and a second signal line of a differential transmission line, includes a first inductance element (L1) that is to be inserted in series with the first signal line; a second inductance element (L2) that is to be inserted in series with the second signal line; a third inductance element (L3) that includes a first end connected to a neutral point with respect to the first signal line and the second signal line and includes a second end to be connected to the first signal line; a fourth inductance element (L4) that includes a first end connected to the neutral point and includes a second end to be connected to the second signal line; a fifth capacitance element (C5) that is connected between the neutral point and ground; a first shunt connection capacitance element (C1/C2) that is connected between the first inductance element (L1) and the third inductance element (L3); and a second shunt connection capacitance element (C3/C4) that is connected between the second inductance element (L2) and the fourth inductance element (L4); wherein an attenuation pole (f3) is defined by a series resonant circuit including the first shunt connection capacitance element (C1/C2), the third inductance element (L3) and the fifth capacitance element (C5) and a series resonant circuit including the second shunt connection capacitance element (C3/C4), the fourth inductance element (L4) and the fifth capacitance element (C5), and an attenuation pole (f2) is defined by a parallel resonant circuit including the first inductance element (L1) and the first shunt connection capacitance element (C1/C2) and a parallel resonant circuit including the second inductance element (L2) and the second shunt connection capacitance element (C3/C4).

With this configuration, common mode noise is attenuated across a wide band including an attenuation pole at a frequency (f2) and an attenuation pole at a frequency (f3).

According to various preferred embodiments of the present invention, a common mode filter and an ESD-protection-circuit-equipped common mode filter, despite having a small inductance and a small coupling coefficient, are highly effective at suppressing common mode noise, have excellent characteristics at high frequencies and have small transmission loss.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
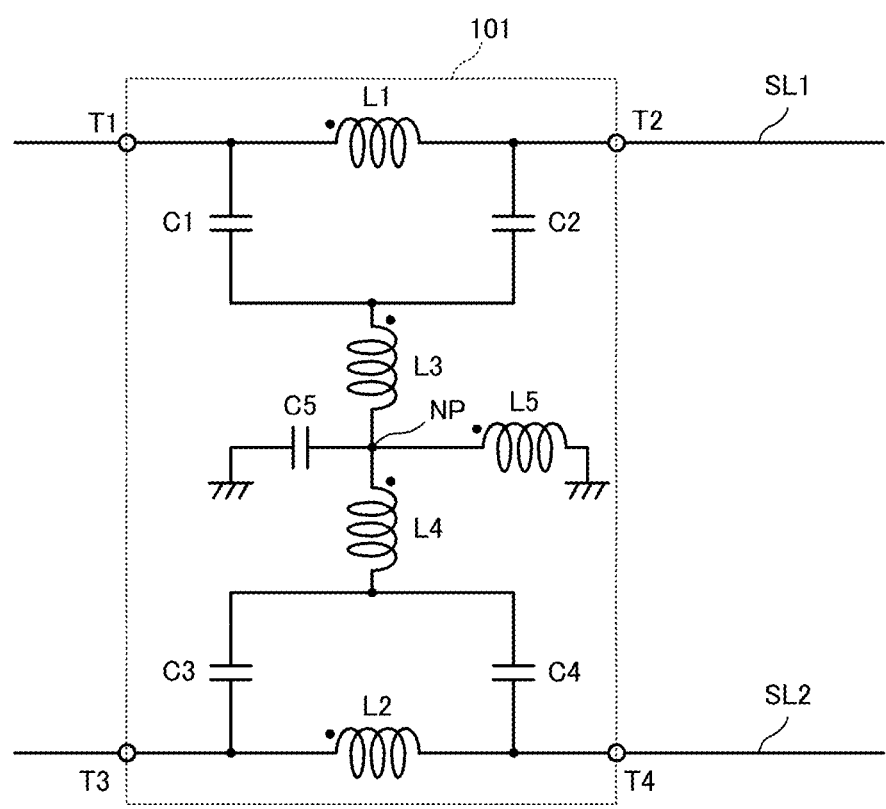
FIG. 1 is a circuit diagram of a common mode filter 101 of a first preferred embodiment of the present invention.

Hereafter, a plurality of preferred embodiments of the present invention will be described by giving a number of specific examples while referring to the drawings. Like symbols denote like portions in the drawings. Each preferred embodiment is an illustrative example and elements or features of the configurations illustrated in different preferred embodiments can be substituted or combined with each other.

First Preferred Embodiment

A common mode filter according to a first preferred embodiment of the present invention will be described with reference to the drawings. FIG. 1 is a circuit diagram of a common mode filter 101 of the first preferred embodiment.

The common mode filter 101 illustrated in FIG. 1 is a balanced filter that is connected to a differential transmission line including a first signal line SL1 and a second signal line SL2. A first inductance element (hereafter, "first inductor") L1 is inserted in series with the first signal line SL1 and a second inductance element (hereafter, "second inductor") L2 is inserted in series with the second signal line SL2. The common mode filter 101 is provided with a ground that defines and functions as a reference for the first signal line SL1 and the second signal line SL2. In addition, the common mode filter 101 includes a third inductance element (hereafter, "third inductor") L3, which includes a first end connected to a neutral point NP with respect to the first signal line SL1 and the second signal line SL2, and a fourth inductance element (hereafter, "fourth inductor") L4, which includes a first end connected to the neutral point NP.

A first capacitance element (hereafter, "first capacitor") C1 is connected between a first end of the first inductor L1 and a second end of the third inductor L3. In addition, a second capacitance element (hereafter, "second capacitor") C2 is connected between a second end of the first inductor L1 and the second end of the third inductor L3.

A third capacitance element (hereafter, "third capacitor") C3 is connected between a first end of the second inductor L2 and a second end of the fourth inductor L4. In addition, a fourth capacitance element (hereafter, "fourth capacitor") C4 is connected between a second end of the second inductor L2 and the second end of the fourth inductor L4.

A fifth inductance element (hereafter "fifth inductor") L5 and a fifth capacitance element (hereafter, "fifth capacitor") C5 are connected between the neutral point NP and ground.

Figure 2A:
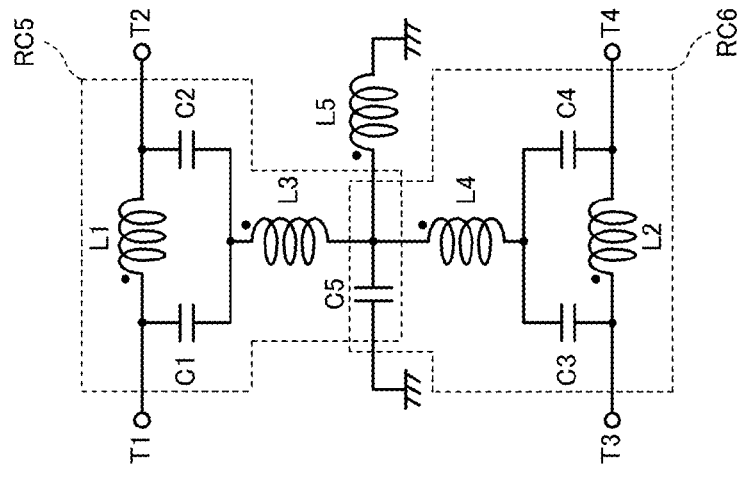
FIGS. 2A to 2C illustrate six resonant circuits included in the common mode filter 101.
Figure 2B:
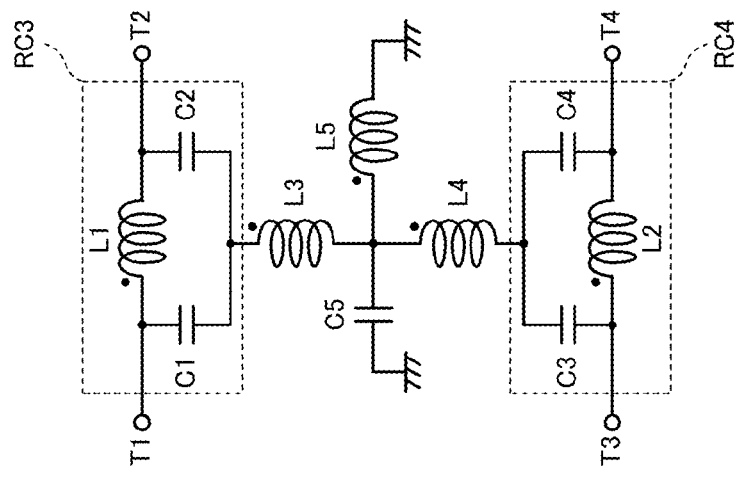
Figure 2C:
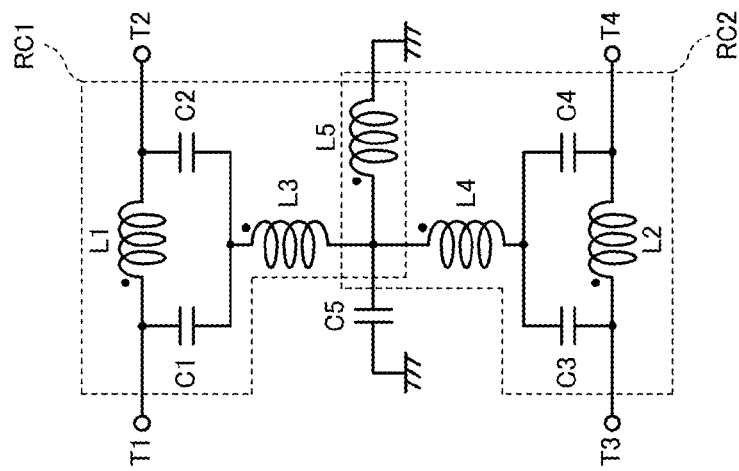

FIGS. 2A to 2C illustrate six resonant circuits included in the common mode filter 101.

As illustrated in FIG. 2A, a first resonant circuit (series resonant circuit) RC1 is defined by the first inductor L1, the first capacitor C1, the second capacitor C2, the third inductor L3 and the fifth inductor L5. In addition, a second resonant circuit (series resonant circuit) RC2 is defined by the second inductor L2, the third capacitor C3, the fourth capacitor C4, the fourth inductor L4 and the fifth inductor L5.

Furthermore, a third resonant circuit (parallel resonant circuit) RC3 is defined by the first inductor L1, the first capacitor C1 and the second capacitor C2. A fourth resonant circuit (parallel resonant circuit) RC4 is defined by the second inductor L2, the third capacitor C3 and the fourth capacitor C4.

A fifth resonant circuit (series resonant circuit) RC5 is defined by the first inductor L1, the first capacitor C1, the second capacitor C2, the third inductor L3 and the fifth capacitor C5. In addition, a sixth resonant circuit (series resonant circuit) RC6 is defined by the second inductor L2, the fourth inductor L4, the third capacitor C3, the fourth capacitor C4 and the fifth capacitor C5.

Figure 3:
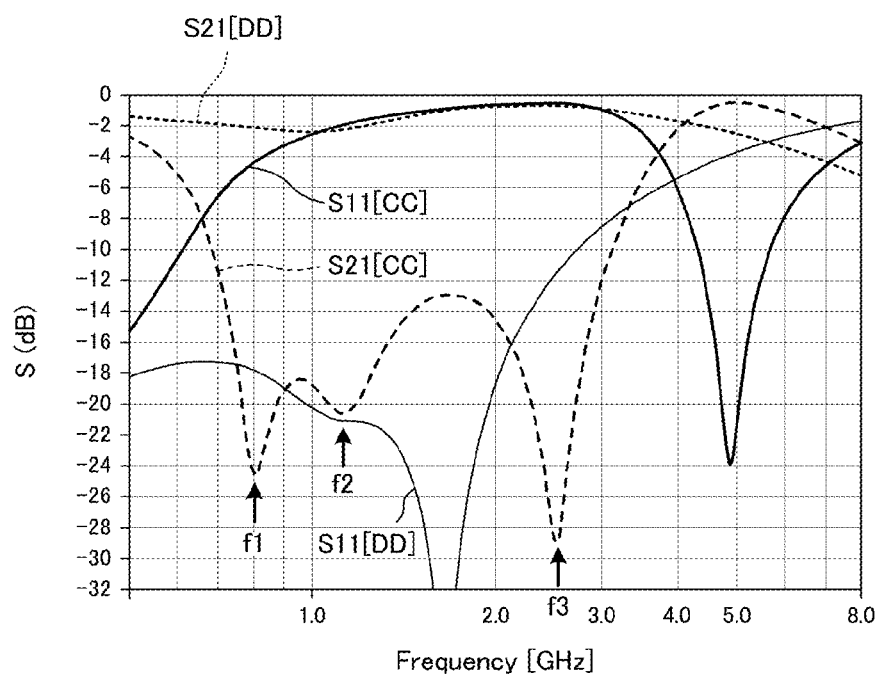
FIG. 3 illustrates the frequency characteristics of return loss and insertion loss seen from balanced terminals (T1 and T3) of the common mode filter 101.

FIG. 3 illustrates the frequency characteristics of return loss and insertion loss seen from balanced terminals (T1 and T3). Here, S21[DD] is the insertion loss of a differential mode signal, S11[DD] is the return loss of a differential mode signal, S21[CC] is the insertion loss of common mode noise and S11[CC] is return loss of common mode noise. Attenuation poles are generated at frequencies f1, f2 and f3 in the insertion loss S21[CC] of the common mode noise. The reason for the generation of these three attenuation poles will be described below.

A circuit defined by the first inductor L1, the first capacitor C1, the second capacitor C2 and the third inductor L3, and a circuit defined by the second inductor L2, the third capacitor C3, the fourth capacitor C4 and the fourth inductor L4 are symmetrical about the neutral point NP. Consequently, operation of the common mode filter 101 with respect to common mode noise can be described using an unbalanced circuit including the upper half or the lower half of the common mode filter 101 from the neutral point NP.

Figure 4:
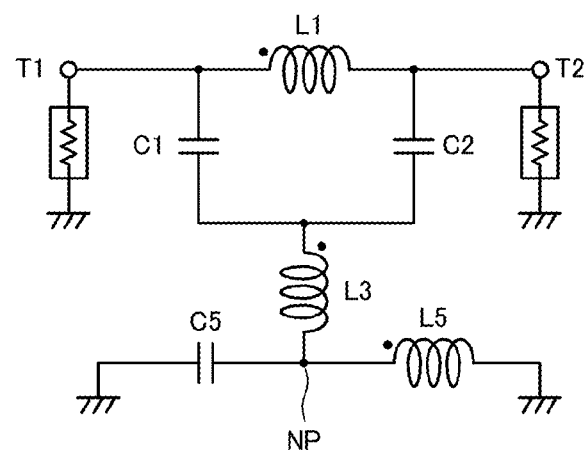
FIG. 4 is a circuit diagram of the upper half of the common mode filter 101.

FIG. 4 is a circuit diagram of the upper half of the common mode filter 101. The values of the elements here preferably are, for example, as follows.

L1: 6 nH
L3: 2 nH
L5: 3.7 nH
C1: 3 pF
C2: 3 pF
C5: 2.4 pF

Figure 5A:
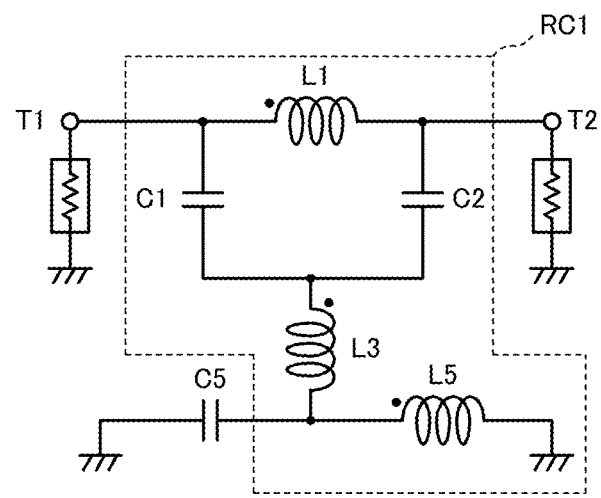
FIG. 5A is a circuit diagram of a first resonant circuit RC1.
Figure 5B:
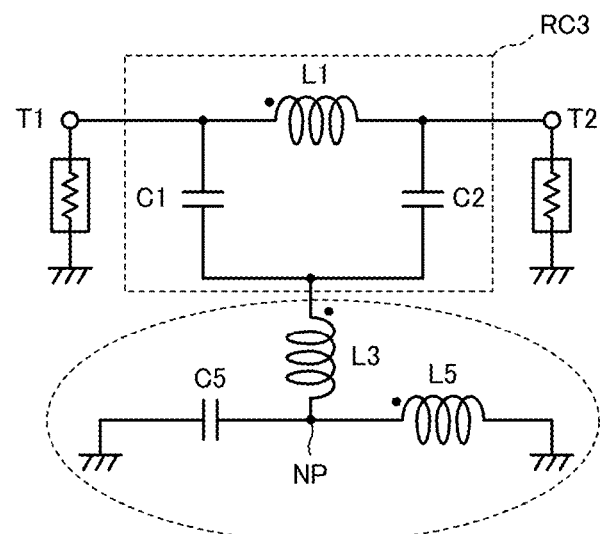
FIG. 5B is a circuit diagram of a third resonant circuit RC3 and FIG. 5C is a circuit diagram of a fifth resonant circuit RC5.
Figure 5C:
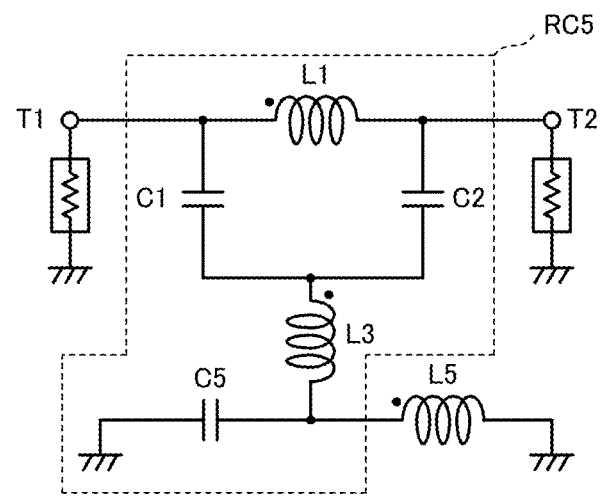

FIG. 5A is a circuit diagram of the first resonant circuit RC1, FIG. 5B is a circuit diagram of the third resonant circuit RC3 and FIG. 5C is a circuit diagram of the fifth resonant circuit RC5.

Figure 6A:
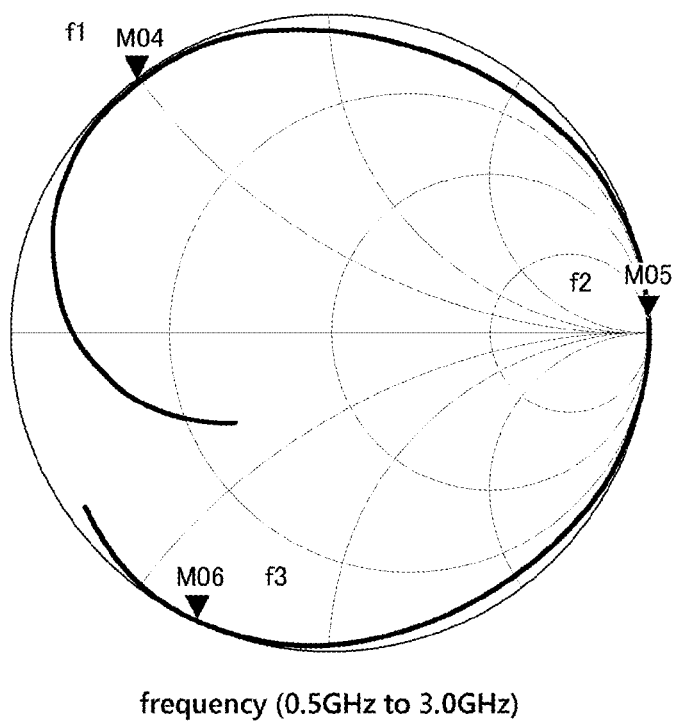
FIG. 6A illustrates the locus of impedance seen from the terminal T1 of the circuit illustrated in FIG. 4 when the frequency is swept from 500 MHz to 3.0 GHz.
Figure 6B:
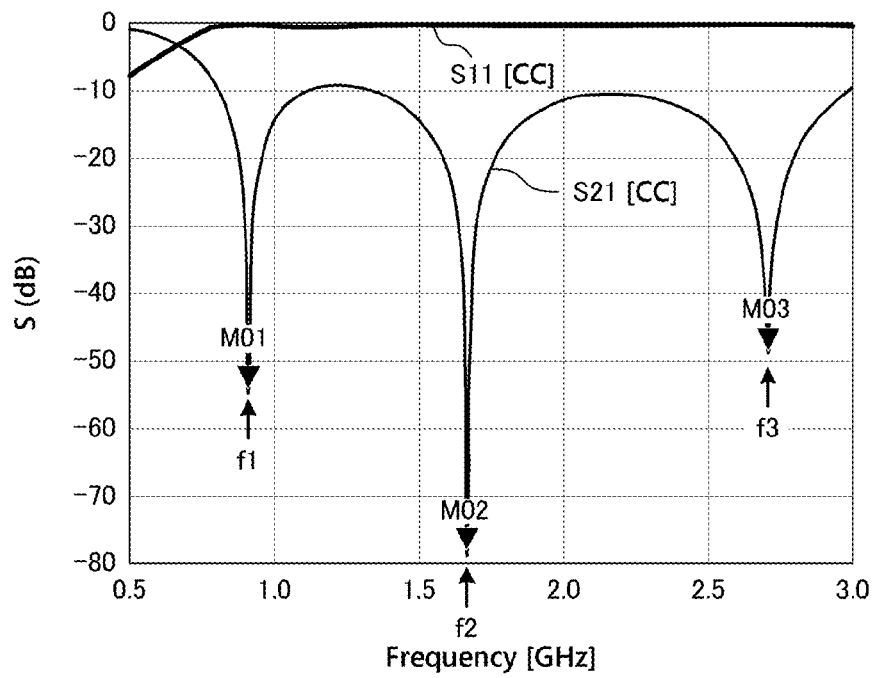
FIG. 6B illustrates the frequency characteristics of return loss and insertion loss seen from the terminal T1.

FIG. 6A illustrates the locus of impedance seen from the terminal T1 of the circuit illustrated in FIG. 4 when the frequency is swept from 500 MHz to 3.0 GHz, for example. FIG. 6B illustrates the frequency characteristics of return loss and insertion loss seen from the terminal T1. Both figures illustrate simulation results obtained in a state where the terminals T1 and T2 are terminated with 50Ω, for example. In FIGS. 6A and 6B, the frequencies at positions indicated by the markers preferably are, for example, as follows.

M01: 910 MHz (f1)
M02: 1.67 GHz (f2)
M03: 2.71 GHz (f3)

Attenuation of the return loss at the frequency f1 is due to the first resonant circuit RC1. In other words, the first resonant circuit RC1 serially resonates with the common mode noise at the frequency f1 and the common mode noise is shunted.

Attenuation of the return loss at the frequency f2 is due to the third resonant circuit RC3. In other words, the third resonant circuit RC3 resonates in parallel with the common mode noise at the frequency f2 and propagation of the common mode noise is interrupted (reflected).

Attenuation of the return loss at the frequency f3 is due to the fifth resonant circuit RC5. In other words, the fifth resonant circuit RC5 serially resonates with the common mode noise at the frequency f3 and the common mode noise is shunted.

As described above, the common mode filter 101 is symmetrical about the neutral point NP and therefore the second resonant circuit RC2 illustrated in FIG. 2A operates in the same way as the first resonant circuit RC1. In addition, the fourth resonant circuit RC4 illustrated in FIG. 2B operates in the same way as the third resonant circuit RC3. The sixth resonant circuit RC6 illustrated in FIG. 2C operates in the same way as the fifth resonant circuit RC5.

Although the common mode filter may operate with just either one of the third inductor L3 and the fourth inductor L4, when there is just one inductor, despite there being an advantage in terms of size reduction, the circuit becomes non-symmetrical and therefore the conversion amount from the common mode to the differential mode and the conversion amount from the differential mode to the common mode are large.

Figure 7:
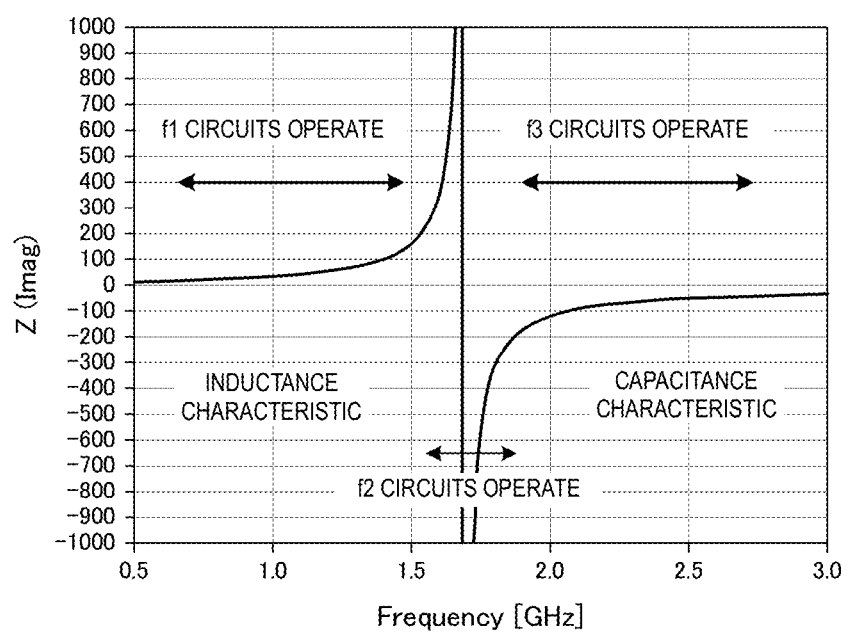
FIG. 7 illustrates the frequency characteristics of an imaginary component of the impedance seen from a neutral point NP.

In FIG. 5B, the fifth inductor L5 and the fifth capacitor C5 define an LC parallel circuit. FIG. 7 illustrates the frequency characteristics of an imaginary component of the impedance seen from the neutral point NP. As illustrated in FIG. 5B, the third resonant circuit RC3 operates as a parallel resonant circuit in a frequency band where the impedance of the LC parallel circuit defined by the fifth inductor L5 and the fifth capacitor C5 is sufficiently larger than the parallel resonant impedance of the third resonant circuit RC3. Therefore, it is preferable that the resonant frequency of the third resonant circuit RC3 be equal to or close to the resonant frequency of the LC parallel circuit defined by the fifth inductor L5 and the fifth capacitor C5.

As illustrated in FIG. 6B, a first resonant frequency f1, which is the resonant frequency of the first and second resonant circuits, a second resonant frequency f2, which is the resonant frequency of the third and fourth resonant circuits, and a third resonant frequency f3, which is the resonant frequency of the fifth and sixth resonant circuits, are different from one another. Consequently, common mode noise is attenuated across a wide band.

As illustrated in FIG. 1, the common mode filter according to this preferred embodiment includes the first inductance element L1 inserted in series with the first signal line SL1, the second inductance element L2 inserted in series with the second signal line SL2, the third inductance element L3 including a first end connected to the neutral point NP with respect to the first signal line SL1 and the second signal line SL2 and a second end connected to the first signal line SL1, a fourth inductance element L4 including a first end connected to the neutral point NP and a second end connected to the second signal line SL2, the fifth inductance element L5 connected between the neutral point NP and ground, a first shunt connection capacitance element (C1/C2) connected between the first inductance element L1 and the third inductance element L3 and a second shunt connection capacitance element (C3/C4) connected between the second inductance element L2 and the fourth inductance element L4.

As illustrated in FIG. 2A, the series resonant circuit RC1 includes the first shunt connection capacitance element (C1/C2), the third inductance element L3 and the fifth inductance element L5. In addition, the series resonant circuit RC2 includes the second shunt connection capacitance element (C3/C4), the fourth inductance element L4 and the fifth inductance element L5.

Furthermore, as illustrated in FIG. 2B, the parallel resonant circuit RC3 includes the first inductance element L1 and the first shunt connection capacitance element (C1/C2). The parallel resonant circuit RC4 includes the second inductance element L2 and the second shunt connection capacitance element (C3/C4).

Thus, the series resonant circuits RC1 and RC2 and the parallel resonant circuits RC3 and RC4 are coupled due to sharing some elements (L1, C1, C2, L2, C3 and C4). One resonant circuit is a series resonant circuit (RC1 or RC2) and the other resonant circuit is a parallel resonant circuit (RC3 or RC4) and therefore the attenuation in a frequency band between the attenuation pole at the frequency f1 due to the series resonant circuits RC1 and RC2 and the attenuation pole at the frequency f2 due to the parallel resonant circuits RC3 and RC4 is large. A series resonant circuit and a parallel resonant circuit are coupled and therefore the band is widened without the two attenuation poles becoming isolated. That is, the attenuated band of common mode noise is widened.

As illustrated in FIG. 2C, the series resonant circuit RC5 includes the first shunt connection capacitance element (C1/C2), the third inductance element L3 and the fifth capacitance element C5. In addition, the series resonant circuit RC6 includes the second shunt connection capacitance element (C3/C4), the fourth inductance element L4 and the fifth capacitance element C5.

Thus, the series resonant circuits RC5 and RC6 and the parallel resonant circuits RC3 and RC4 are coupled as a result of sharing some elements (L1, C1, C2, L2, C3 and C4). One resonant circuit is a series resonant circuit (RC5 or RC6) and the other resonant circuit is a parallel resonant circuit (RC3 or RC4) and therefore the attenuation in a frequency band between the attenuation pole at the frequency f3 due to the series resonant circuits RC5 and RC6 and the attenuation pole at the frequency f2 due to the parallel resonant circuits RC3 and RC4 is large. A parallel resonant circuit and a series resonant circuit are coupled and therefore the band is widened without the two attenuation poles becoming isolated. That is, the attenuated band of common mode noise is widened.

As described above, the series resonant circuits RC1 and RC2 that provide the attenuation pole at the frequency f1 and the parallel resonant circuits RC3 and RC4 that provide the attenuation pole at the frequency f2 couple with each other and the parallel resonant circuits RC3 and RC4 that provide the attenuation pole at the frequency f2 and the series resonant circuits RC5 and RC6 that provide the attenuation pole at the frequency f3 couple with each other, such that common mode noise is attenuated across a wide band including the frequencies f1, f2 and f3, as illustrated in FIG. 3.

Figure 8:
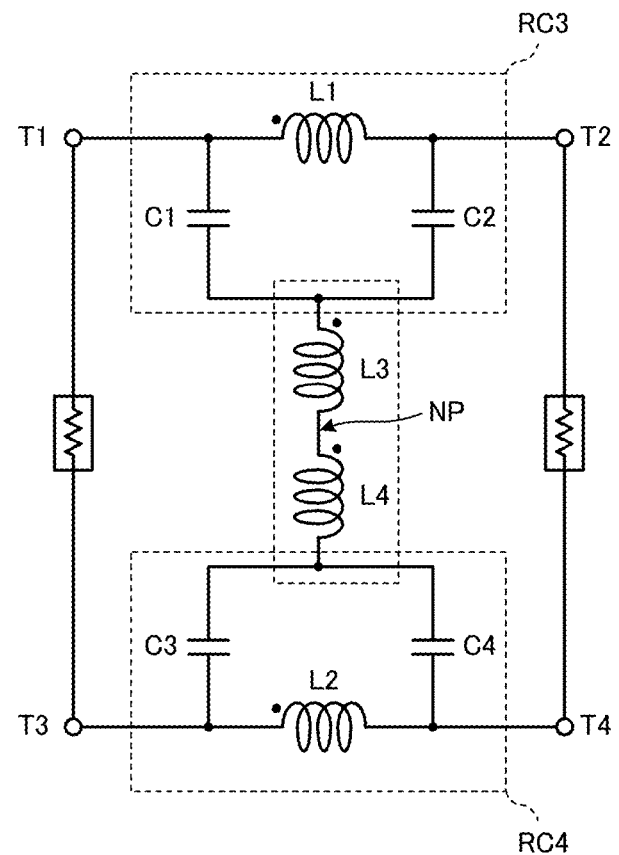
FIG. 8 illustrates operation of the common mode filter 101 for a differential mode signal.
Figure 9:
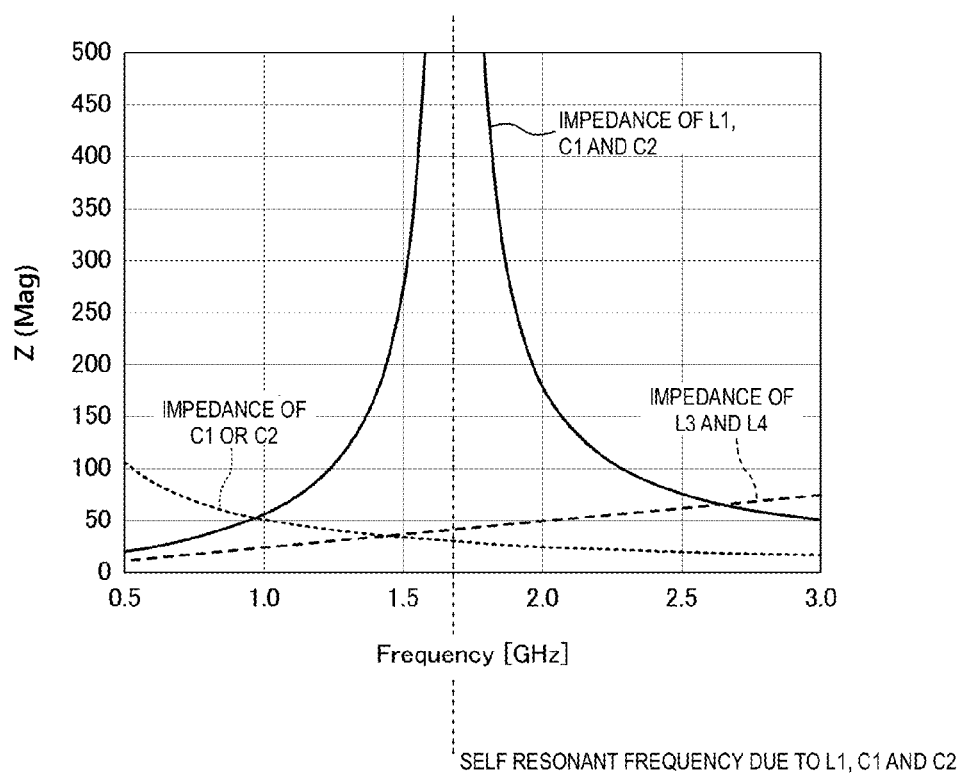
FIG. 9 illustrates the frequency characteristics of the absolutes value of the impedance of the circuit of FIG. 8 seen from the terminals T1 and T3.

FIG. 8 illustrates operation of the common mode filter 101 for a differential mode signal. The neutral point NP is at the ground potential with respect to a differential mode signal and therefore the circuit configuration can be represented as in FIG. 8 with the fifth inductor L5 and the fifth capacitor C5 illustrated in FIG. 1 equivalently not existing. FIG. 9 illustrates the frequency characteristics of the absolute value of the impedance of the circuit of FIG. 8 seen from the terminals T1 and T3.

It would be necessary that the impedance of the series circuit defined by the third inductor L3 and the fourth inductor L4 be sufficiently larger compared with the impedance of the capacitors C1, C2, C3 and C4 in order for the third resonant circuit RC3 and the fourth resonant circuit RC4 illustrated in FIG. 8 to undergo self-resonance (parallel resonance) in the differential mode, but, as illustrated in FIG. 9, the impedance of the capacitors C1 and C2 (C3 and C4) at the self-resonant frequency is not sufficiently large compared with the impedance of the series circuit defined by the third inductor L3 and the fourth inductor L4. Therefore, the differential mode signal passes through with low loss without being blocked (reflected) by parallel resonance of the third resonant circuit RC3 and the fourth resonant circuit RC4.

Second Preferred Embodiment

In a second preferred embodiment of the present invention, an example is illustrated in which characteristics are determined by the coupling of the third inductor L3 and the fourth inductor L4.

A circuit diagram of a common mode filter according to the second preferred embodiment is the same as that illustrated in FIG. 1 for the first preferred embodiment. In FIG. 1, when adopting a configuration in which the third inductor L3 and the fourth inductor L4 are coupled with each other, there is a configuration in which the inductors are differentially coupled for a common mode current and cumulatively coupled for a differential mode current (hereafter, "differential coupling"), and conversely, there is a configuration in which the inductors are cumulatively coupled for a common mode current and differentially coupled for a differential mode current (hereafter, "cumulative coupling").

Figure 10A:
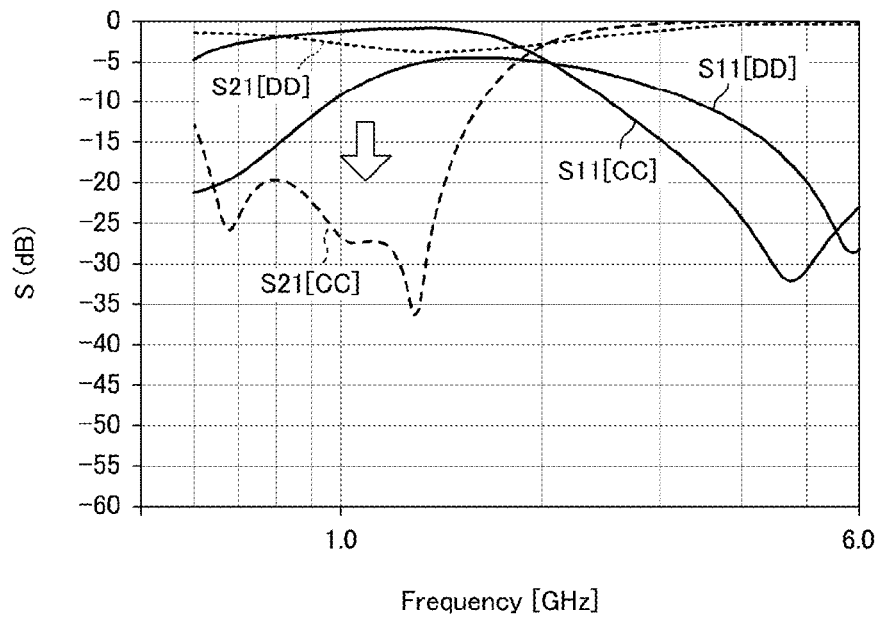
FIG. 10A illustrates the frequency characteristics of the common mode filter when a third inductor L3 and a fourth inductor L4 are in a differential coupling configuration.
Figure 10B:
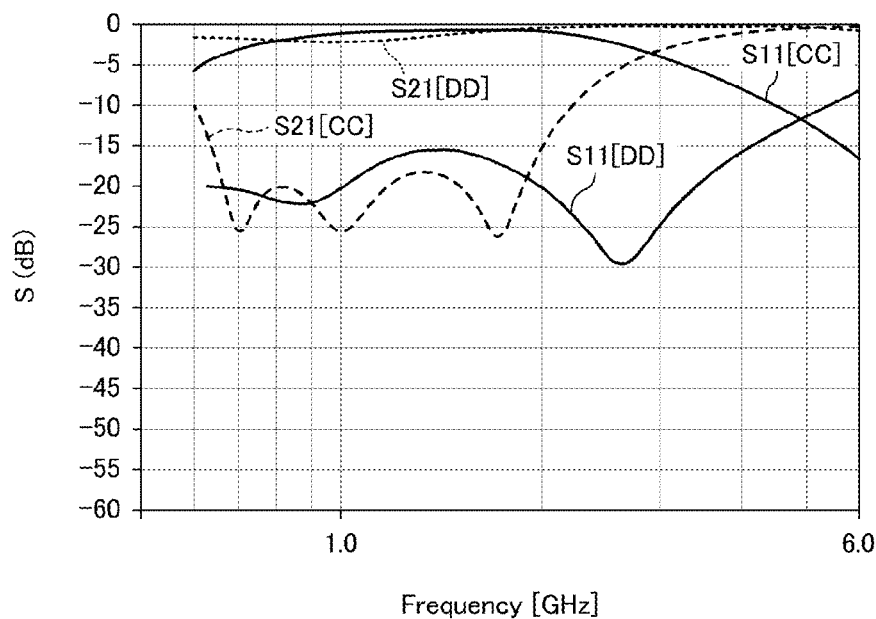
FIG. 10B illustrates the frequency characteristics of the common mode filter when the third inductor L3 and the fourth inductor L4 are in a cumulative coupling configuration.

FIG. 10A illustrates frequency characteristics of the common mode filter when the differential coupling configuration is adopted. FIG. 10B illustrates frequency characteristics of the common mode filter when the cumulative coupling configuration is adopted. Here, S21[DD] is the insertion loss of a differential mode signal, S11[DD] is the return loss of a differential mode signal, S21[CC] is the insertion loss of common mode noise and S11[CC] is return loss of common mode noise. In this example, the coupling coefficient between the third inductor L3 and the fourth inductor L4 was 0.5. As is clear from comparing FIGS. 10A and 10B, attenuation of common mode noise in the vicinity of 2 GHz is greatly increased with the differential coupling configuration.

In addition, as a result of the third inductor L3 and the fourth inductor L4 having a relationship in which the common mode currents are differentially coupled, the differential mode currents are cumulatively coupled and therefore the number of turns and the length of the conductors needed to obtain prescribed inductances is able to be made small. As a result, size reduction is achieved and differential mode insertion loss also is reduced.

Figure 11A:
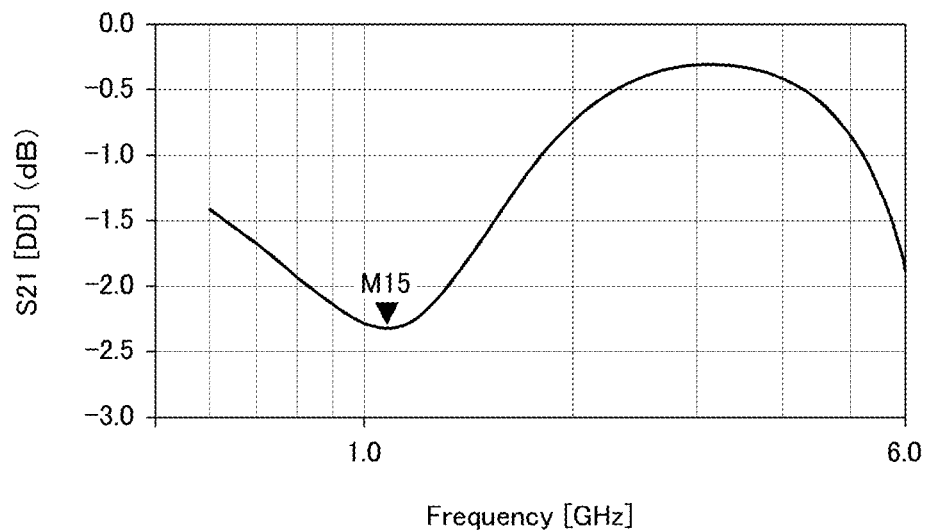
FIG. 11A illustrates differential mode insertion loss of a common mode filter in which "differential coupling" occurs (cumulative coupling for differential mode currents) and FIG. 11B illustrates differential mode insertion loss of a common mode filter in which "cumulative coupling" occurs (differential coupling for differential mode currents).
Figure 11B:
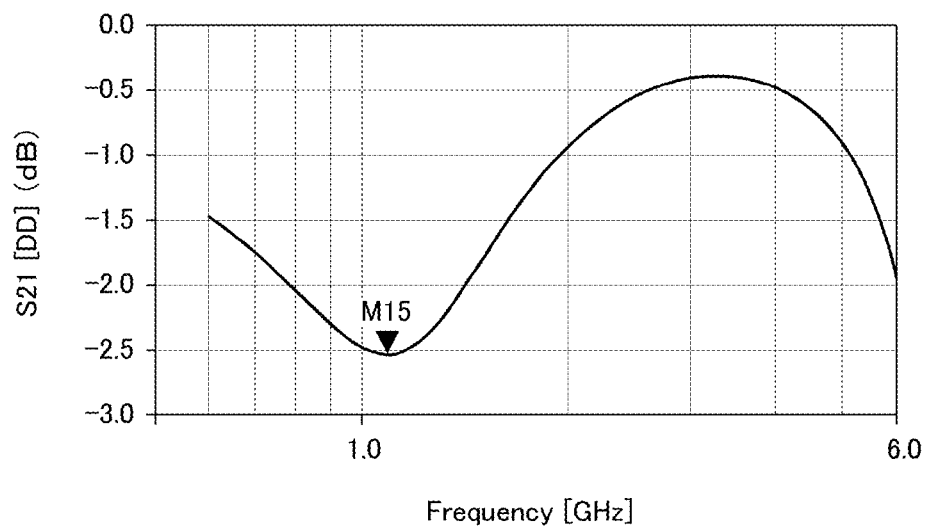

FIG. 11A illustrates differential mode insertion loss of a common mode filter in which "differential coupling" occurs (cumulative coupling for differential mode currents) and FIG. 11B illustrates differential mode insertion loss of a common mode filter in which "cumulative coupling" occurs (differential coupling for differential mode currents). In this example, the coupling coefficient between the third inductor L3 and the fourth inductor L4 was 0.5.

Thus, as is clear from comparing FIGS. 11A and 11B, insertion loss of a differential mode signal in the vicinity of 1 GHz is made small with the differential coupling configuration.

Third Preferred Embodiment

In a third preferred embodiment of the present invention, an example is illustrated in which a common mode filter is provided in a re-wiring layer of a semiconductor substrate.

Figure 12:
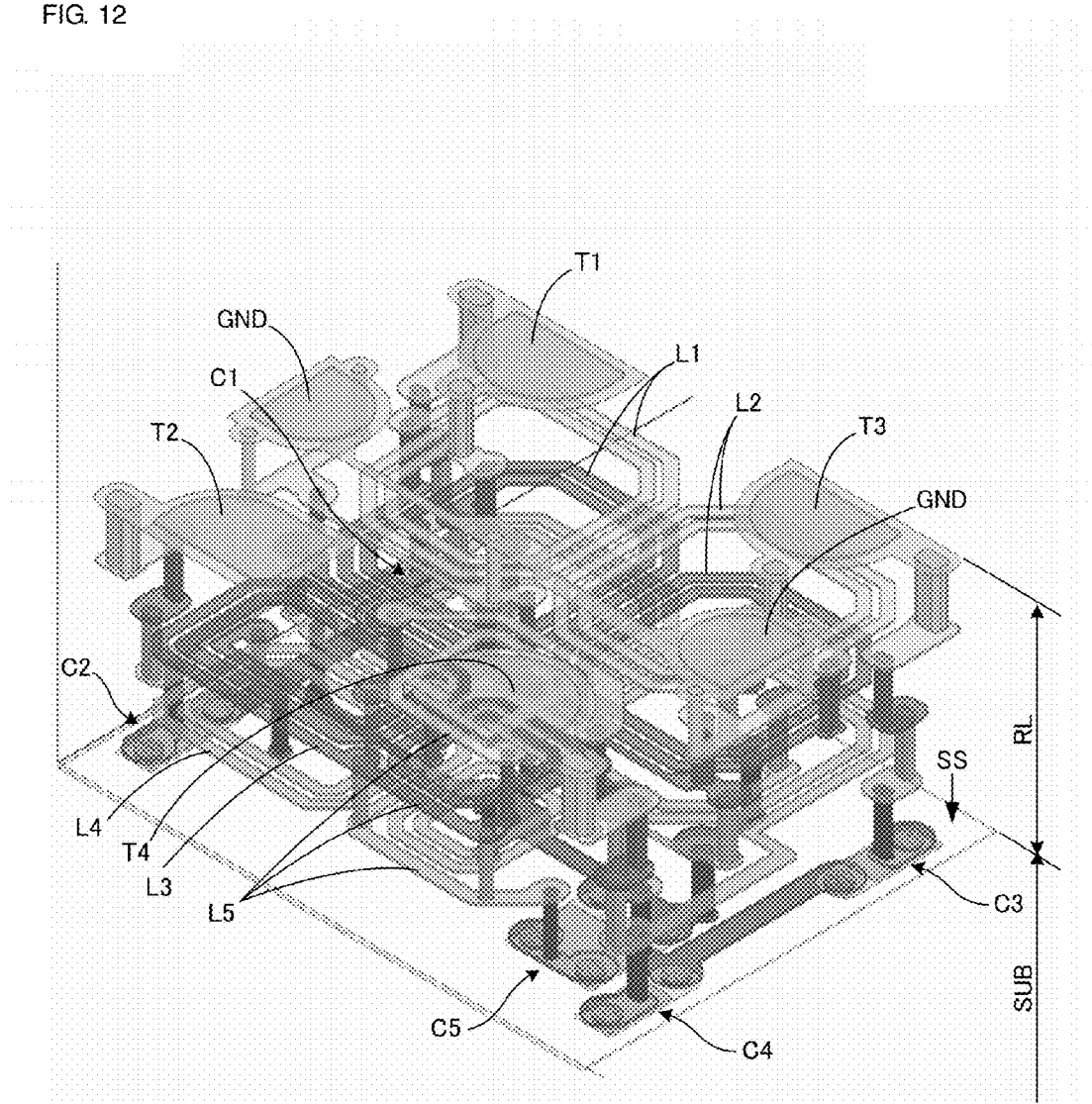
FIG. 12 is a perspective view of an ESD-protection-circuit-equipped common mode filter according to a third preferred embodiment of the present invention.
Figure 13:
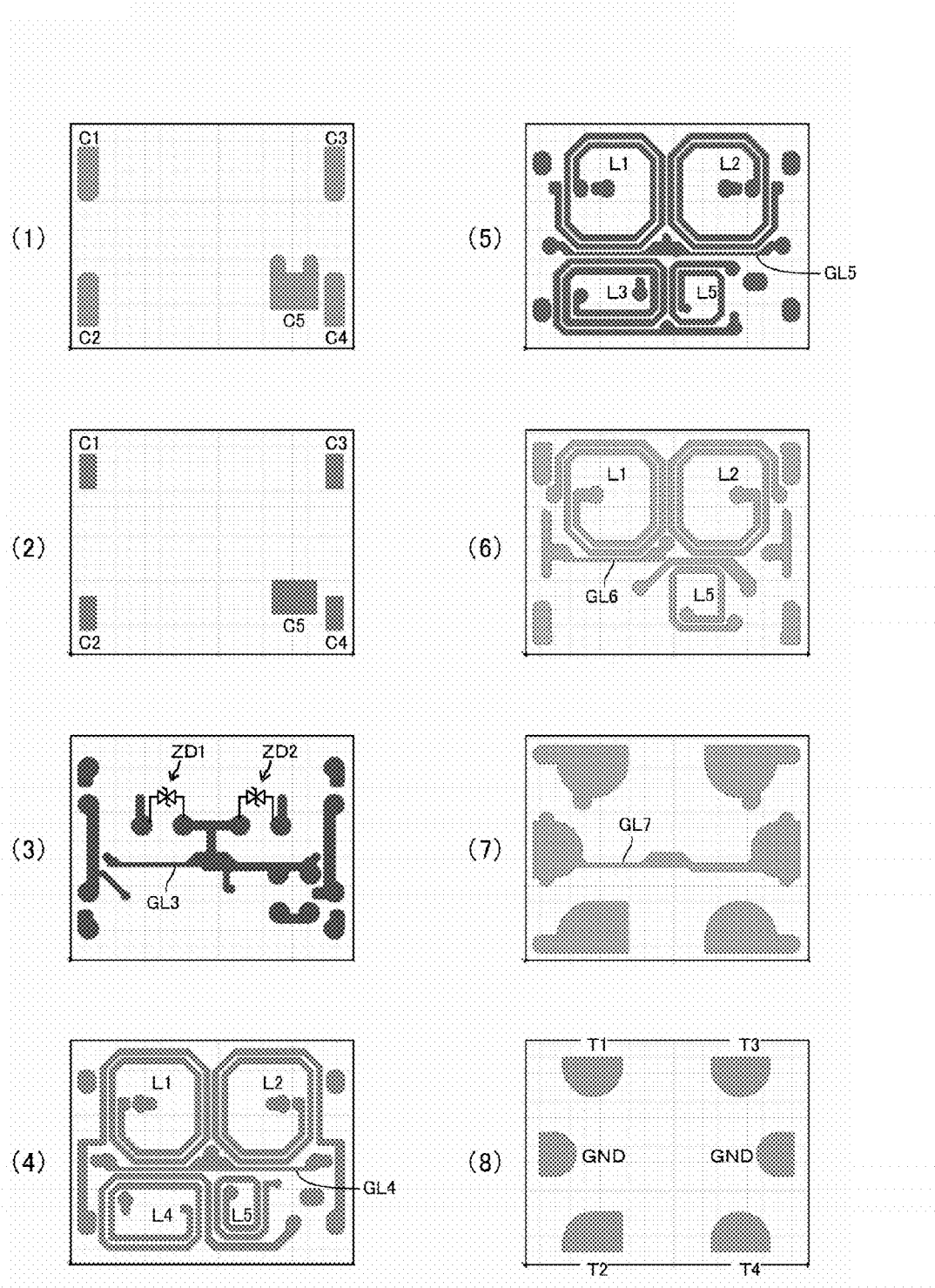
FIG. 13 is a plan view of each layer of a re-wiring layer of the ESD-protection-circuit-equipped common mode filter according to the third preferred embodiment of the present invention.
Figure 14:
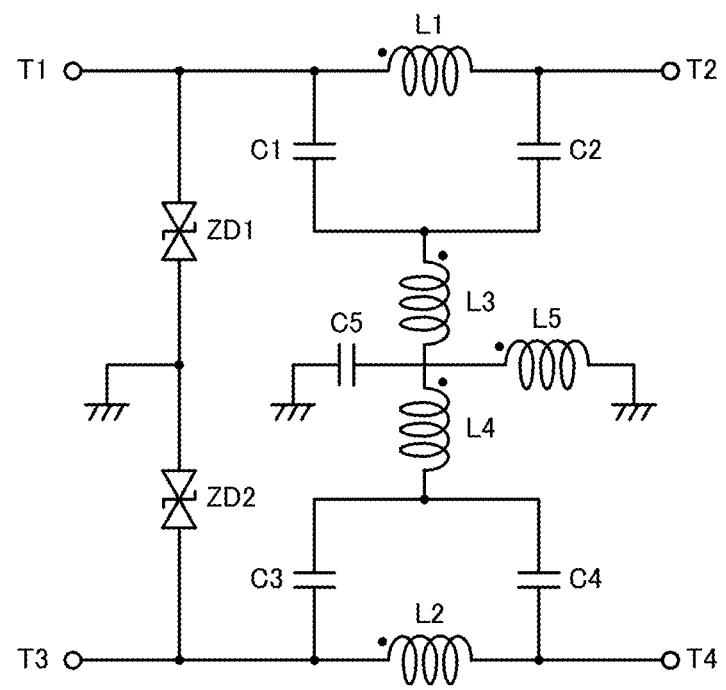
FIG. 14 is a circuit diagram of the ESD-protection-circuit-equipped common mode filter according to the third preferred embodiment of the present invention.

FIG. 12 is a perspective view of an ESD-protection-circuit-equipped common mode filter according to the third preferred embodiment. A structure defined by a plurality of layers is illustrated and therefore the thickness in the stacking direction is drawn in an exaggerated manner. FIG. 13 is a plan view of each layer of the re-wiring layer. FIG. 14 is a circuit diagram of the ESD-protection-circuit-equipped common mode filter of this preferred embodiment.

FIG. 12 specifically illustrates a re-wiring layer RL provided on a surface of a semiconductor substrate SUB. In FIG. 12, a surface SS is the surface of the semiconductor substrate and is a surface below the re-wiring layer. Bidirectional Zener diodes ZD1 and ZD2 are defined by p-diffusion layers and re-diffusion layers in the semiconductor substrate SUB. These bidirectional Zener diodes are elements to define an ESD protection device. Symbols that denote each circuit element formed in the re-wiring layer are shown in FIG. 12.

In FIG. 13, a first layer (1) is a capacitor lower electrode layer and is the lowermost layer. A second layer (2) is a capacitor upper electrode layer, a third layer (3) is a wiring layer, fourth to sixth layers (4), (5) and (6) are inductor layers, a seventh layer (7) is a wiring layer and an eighth layer (8) is an input/output electrode layer and is the uppermost layer. Symbols denoting each circuit element are shown in FIG. 13.

The bidirectional Zener diodes ZD1 and ZD2 illustrated in the wiring layer (3) in FIG. 13 are elements provided in the semiconductor substrate. The bidirectional Zener diodes ZD1 and ZD2 are electrically connected to certain portions of the electrode pattern of the third layer (3). In this way, the bidirectional Zener diode ZD1 is connected between the terminal T1 and ground and the bidirectional Zener diode ZD2 is connected between the terminal T3 and ground.

In FIG. 13, the first inductor L1, the second inductor L2 and the fifth inductor L5 are provided across the fourth layer (4) to the sixth layer (6). In addition, the third inductor L3 is provided on the fourth layer (4) and the third inductor L3 is provided on the fifth layer (5).

The first inductor L1 is connected between the terminal T1 and the terminal T2 and the second inductor L2 is connected between the terminal T3 and the terminal T4.

The capacitors C1, C2, C3, C4 and C5 are respectively defined by electrodes C1, C2, C3, C4 and C5 provided on the first layer (1) illustrated in FIG. 13 and opposing electrodes C1, C2, C3, C4 and C5 provided on the second layer (2). One end of the capacitor C1 and one end of the capacitor C2 are respectively connected to the terminals T1 and T2 and the other ends of the capacitors C1 and C2 are connected to one end of the third inductor L3. One end of the capacitor C3 and one end of the capacitor C4 are respectively connected to the terminals T3 and T4 and the other ends of the capacitors C3 and C4 are connected to one end of the fourth inductor L4.

A first end of the third inductor L3, a first end of the fourth inductor L4 and a first end of the fifth inductor L5 are connected to each other, defining a common connection point. A second end of the fifth inductor L5 is connected to ground. One end of the capacitor C5 is connected to the common connection point (neutral point) between the first end of the third inductor L3, the first end of the fourth inductor L4 and the first end of the fifth inductor L5, and the other end of the capacitor C5 is connected to ground.

The coil winding axes of the first inductor L1 and the second inductor L2 extend in the stacking direction (direction orthogonal to surfaces) of the re-wiring layer. The directions of currents flowing in portions adjacent to the first inductor L1 and the second inductor L2 are determined such that the first inductor L1 and the second inductor L2 are coupled with opposite polarities for common mode currents and such that the first inductor L1 and the second inductor L2 are coupled with the same polarity for differential mode currents. That is, the coil winding directions of the first inductor L1 and the second inductor L2 are determined.

The third inductor L3 and the fourth inductor L4 are wound and connected such that the magnetic field of the third inductor L3 and the magnetic field of the fourth inductor L4 weaken each other (differentially couple) for common mode currents and such that the magnetic field of the third inductor L3 and the magnetic field of the fourth inductor L4 strengthen each other (cumulatively couple) for differential mode signals.

In FIG. 13, electrodes GL3, GL4, GL5, GL6 and GL7 are ground electrode lines that connect two ground terminals GND to each other. The inductance component and the resistance component between the two ground terminals GND are able to be made small providing ground electrode lines on a plurality of layers in this way. Therefore, when the common mode filter is inserted into a differential transmission line, the ground impedance is low and the effect of suppressing a common mode signal (noise) is high for a common mode current.

In addition, by providing the ground electrode lines on a plurality of layers, the first inductor L1 and the second inductor L2, and the fourth inductor L4 and the fifth inductor L5 are isolated (shielded) from each other in terms of their electric fields. Consequently, unwanted coupling between the first inductor L1 and the second inductor L2, and the fourth inductor L4 and the fifth inductor L5 is suppressed and conversion from the common mode to the differential mode and conversion from the differential mode to the common mode are suppressed.

Thus, a common mode filter can be provided in a re-wiring layer on a semiconductor substrate. In addition, an ESD-protection-function-equipped common mode filter can be provided by forming the common mode filter in the re-wiring layer on a semiconductor substrate in which the bidirectional Zener diodes ZD1 and ZD2 are provided.

Fourth Preferred Embodiment

In a fourth preferred embodiment of the present invention, an example is illustrated in which a common mode filter is provided in a ceramic multilayer substrate. The circuit diagram is the same as that illustrated in FIG. 1 in the first preferred embodiment.

Figure 15:
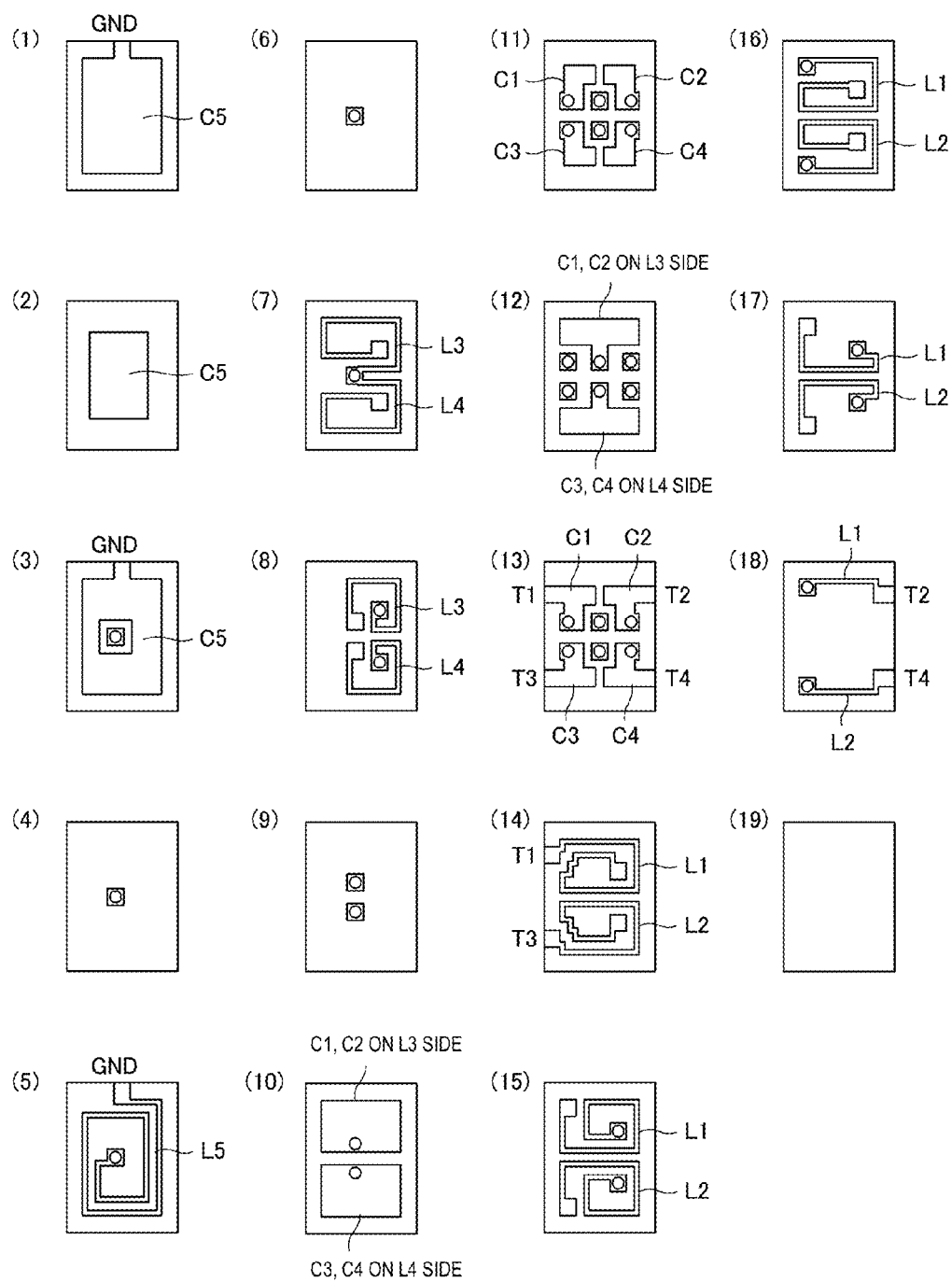
FIG. 15 is a plan view of each layer of a common mode filter according to a fourth preferred embodiment of the present invention.

FIG. 15 is a plan view of each layer of a common mode filter according to the fourth preferred embodiment. Symbols denoting each circuit element are shown in FIG. 15.

In FIG. 15, a layer (1) is the lowermost layer and a layer (19) is the uppermost layer. Layers (1), (2) and (3) are layers on which the fifth capacitor C5 is provided, a layer (5) is a layer on which the fifth inductor L5 is provided, and layers (7) and (8) are layers on which the third inductor L3 and the fourth inductor L4 are provided. Layers (10) to (13) are layers on which the capacitors C1, C2, C3 and C4 are provided. Layers (14) to (18) are layers on which the first inductor L1 and the second inductor L2 are provided. In FIG. 15, the small circular patterns illustrated in many of the layers are via conductors. Layers (4), (6) and (9) are layers in which via conductors are provided.

The fifth capacitor C5 is defined by electrodes (ground conductors) C5 provided on the layers (1) and (3) and an electrode C5 provided on the layer (2). The first inductor L1 is connected between the terminal T1 and the terminal T2 and the second inductor L2 is connected between the terminal T3 and the terminal T4.

One end of the capacitor C1 and one end of the capacitor C2 are respectively connected to the terminals T1 and T2 and the other ends of the capacitors C1 and C2 are connected to one end of the third inductor L3. One end of the capacitor C3 and one end of the capacitor C4 are respectively connected to the terminals T3 and T4 and the other ends of the capacitors C3 and C4 are connected to one end of the fourth inductor L4.

A first end of the third inductor L3, a first end of the fourth inductor L4 and a first end of the fifth inductor L5 are connected to each other, defining a common connection point, through via conductors of the layers (5), (6) and (7). A second end of the fifth inductor L5 is connected to ground. One end of the capacitor C5 is connected to the common connection point (neutral point) between the first end of the third inductor L3, the first end of the fourth inductor L4 and the first end of the fifth inductor L5, and the other end of the capacitor C5 is connected to ground.

The coil winding axes of the first inductor L1 and the second inductor L2 extend in the stacking direction (direction orthogonal to surfaces) of the layers. The directions of currents flowing in portions adjacent to the first inductor L1 and the second inductor L2 are determined such that the first inductor L1 and the second inductor L2 are coupled with opposite polarities for common mode currents and such that the first inductor L1 and the second inductor L2 are coupled with the same polarity for differential mode currents. That is, the coil winding directions of the first inductor L1 and the second inductor L2 are determined.

The third inductor L3 and the fourth inductor L4 are wound and connected such that the third inductor L3 and the fourth inductor L4 are differentially coupled for common mode currents and such that the third inductor L3 and the fourth inductor L4 are cumulatively coupled for differential mode signals.

Since a structure is adopted in which the layers on which the capacitors C1, C2, C3 and C4 are provided are interposed between the layers on which the third inductor L3 and the fourth inductor L4 are provided and the layers on which the first inductor L1 and the second inductor L2 are provided, the electrodes used to the define the capacitors C1, C2, C3 and C4 block magnetic fields. Consequently, unwanted coupling between the layers on which the third inductor L3 and the fourth inductor L4 are provided and the layers on which the first inductor L1 and the second inductor L2 are provided is suppressed.

Thus, a common mode filter is able to be provided in a ceramic multilayer substrate. A discharge gap that is connected between the terminal T1 and the ground terminal and between the terminal T2 and the ground terminal may be provided inside the ceramic multilayer substrate and an ESD protection circuit may be provided by this discharge gap. In this way, an ESD-protection-circuit-equipped common mode filter is provided.

Figure 16:
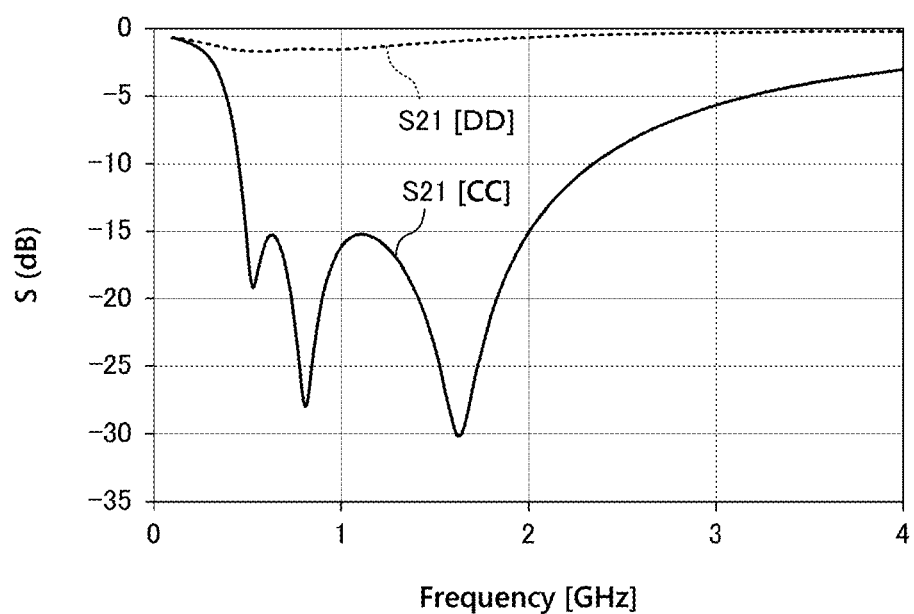
FIG. 16 illustrates frequency characteristics of the insertion loss of the common mode filter according to the fourth preferred embodiment of the present invention.

FIG. 16 illustrates frequency characteristics of the insertion loss of the common mode filter of this preferred embodiment. Here, S21[CC] is insertion loss of common mode noise and S21[DD] is insertion loss of a differential mode signal.

Thus, a common mode filter is able to be provided in a multilayer substrate. Furthermore, an ESD-protection-function-equipped common mode filter may be provided by disposing an ESD protection discharge gap inside a multilayer substrate.

In the circuit diagrams of the preferred embodiments described above, the first inductor L1, the second inductor L2, the fifth inductor L5 and so forth are represented using coil circuit symbols with attached dot symbols, but the coil winding directions of the inductors are not limited to those illustrated.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A common mode filter that is to be inserted into a first signal line and a second signal line of a differential transmission line, the common mode filter comprising:
   a first inductance element that is to be inserted in series with the first signal line;
   a second inductance element that is to be inserted in series with the second signal line;
   a third inductance element that includes a first end connected to a neutral point with respect to the first signal line and the second signal line;
   a fourth inductance element that includes a first end connected to the neutral point;
   a first capacitance element that is connected between the first end of the first inductance element and a second end of the third inductance element;
   a second capacitance element that is connected between a second end of the first inductance element and the second end of the third inductance element;
   a third capacitance element that is connected between the first end of the second inductance element and a second end of the fourth inductance element;
   a fourth capacitance element that is connected between a second end of the second inductance element and the second end of the fourth inductance element;
   a fifth inductance element that is connected between the neutral point and ground; and
   a fifth capacitance element that is connected between the neutral point and ground; wherein
   a first resonant circuit is defined by the first inductance element, the first capacitance element, the second capacitance element, the third inductance element and the fifth inductance element;
   a second resonant circuit is defined by the second inductance element, the third capacitance element, the fourth capacitance element, the fourth inductance element and the fifth inductance element;
   a third resonant circuit is defined by the first inductance element, the first capacitance element and the second capacitance element;
   a fourth resonant circuit is defined by the second inductance element, the third capacitance element and the fourth capacitance element;
   a fifth resonant circuit is defined by the first inductance element, the third inductance element, the first capacitance element, the second capacitance element and the fifth capacitance element; and
   a sixth resonant circuit is defined by the second inductance element, the fourth inductance element, the third capacitance element, the fourth capacitance element and the fifth capacitance element.

2. The common mode filter according to claim 1, wherein a circuit defined by the first inductance element, the first capacitance element, the second capacitance element and the third inductance element, and a circuit defined by the second inductance element, the third capacitance element, the fourth capacitance element and the fourth inductance element are symmetrical.

3. The common mode filter according to claim 2, wherein a first resonant frequency, which is a resonant frequency of the first and second resonant circuits, a second resonant frequency, which is a resonant frequency of the third and fourth resonant circuits, and a third resonant frequency, which is a resonant frequency of the fifth and sixth resonant circuits, are different from one another.

4. The common mode filter according to claim 2, wherein, at the resonant frequency of the third resonant circuit and the fourth resonant circuit, an impedance of the first capacitance element, the second capacitance element, the third capacitance element and the fourth capacitance element is larger than a series impedance of the third inductance element and the fourth inductance element.

5. A common mode filter that is to be inserted into a first signal line and a second signal line of a differential transmission line, the common mode filter comprising:
   a first inductance element that is to be inserted in series with the first signal line;
   a second inductance element that is to be inserted in series with the second signal line;
   a third inductance element that includes a first end connected to a neutral point with respect to the first signal line and the second signal line and includes a second end connected to the first signal line;
   a fourth inductance element that includes a first end connected to the neutral point and includes a second end connected to the second signal line;
   a fifth inductance element that is connected between the neutral point and ground; and
   a fifth capacitance element that is connected between the neutral point and ground; wherein
   an attenuation pole that attenuates common mode noise is provided inside a passband by a resonant circuit defined by the fifth inductance element and the fifth capacitance element.

6. The common mode filter according to claim 5, wherein the third inductance element and the fourth inductance element are differentially coupled for common mode noise and cumulatively coupled for differential mode signals.

7. An ESD-protection-circuit-equipped common mode filter comprising:

the common mode filter according to claim 1; and
an ESD protection element inserted between the first signal line and ground and between the second signal line and ground.

8. An ESD-protection-circuit-equipped common mode filter comprising:
the common mode filter according to claim 2; and
an ESD protection element inserted between the first signal line and ground and between the second signal line and ground.

9. An ESD-protection-circuit-equipped common mode filter comprising:
the common mode filter according to claim 3; and
an ESD protection element inserted between the first signal line and ground and between the second signal line and ground.

10. An ESD-protection-circuit-equipped common mode filter comprising:
the common mode filter according to claim 4; and
an ESD protection element inserted between the first signal line and ground and between the second signal line and ground.

11. An ESD-protection-circuit-equipped common mode filter comprising:
the common mode filter according to claim 5; and
an ESD protection element inserted between the first signal line and ground and between the second signal line and ground.

12. An ESD-protection-circuit-equipped common mode filter comprising:
the common mode filter according to claim 6; and
an ESD protection element inserted between the first signal line and ground and between the second signal line and ground.

13. The ESD-protection-circuit-equipped common mode filter according to claim 7, wherein the common mode filter is provided in a re-wiring layer of a semiconductor substrate and a Zener diode defining and functioning as the ESD protection element is provided in the semiconductor substrate.

14. A common mode filter that is to be inserted into a first signal line and a second signal line of a differential transmission line, the common mode filter comprising:
a first inductance element that is to be inserted in series with the first signal line;
a second inductance element that is to be inserted in series with the second signal line;
a third inductance element that includes a first end connected to a neutral point with respect to the first signal line and the second signal line and includes a second end connected to the first signal line;
a fourth inductance element that includes a first end connected to the neutral point and includes a second end connected to the second signal line;
a fifth inductance element that is connected between the neutral point and ground;
a first shunt connection capacitance element that is connected between the first inductance element and the third inductance element; and
a second shunt connection capacitance element that is connected between the second inductance element and the fourth inductance element; wherein
an attenuation pole is provided by a series resonant circuit including the first shunt connection capacitance element, the third inductance element and the fifth inductance element and a series resonant circuit including the second shunt connection capacitance element, the fourth inductance element and the fifth inductance element, and an attenuation pole is provided by a parallel resonant circuit including the first inductance element and the first shunt connection capacitance element and a parallel resonant circuit including the second inductance element and the second shunt connection capacitance element.

15. A common mode filter that is to be inserted into a first signal line and a second signal line of a differential transmission line, the common mode filter comprising:
a first inductance element that is to be inserted in series with the first signal line;
a second inductance element that is to be inserted in series with the second signal line;
a third inductance element that includes a first end connected to a neutral point with respect to the first signal line and the second signal line and includes a second end connected to the first signal line;
a fourth inductance element that includes a first end connected to the neutral point and includes a second end connected to the second signal line; and
a fifth capacitance element that is connected between the neutral point and ground;
a first shunt connection capacitance element that is connected between the first inductance element and the third inductance element; and
a second shunt connection capacitance element that is connected between the second inductance element and the fourth inductance element; wherein
an attenuation pole is provided by a series resonant circuit including the first shunt connection capacitance element, the third inductance element and the fifth capacitance element and a series resonant circuit including the second shunt connection capacitance element, the fourth inductance element and the fifth capacitance element, and an attenuation pole is provided by a parallel resonant circuit including the first inductance element and the first shunt connection capacitance element and a parallel resonant circuit including the second inductance element and the second shunt connection capacitance element.

* * * * *